United States Patent [19]

Hashimoto

[11] Patent Number: 5,008,566
[45] Date of Patent: Apr. 16, 1991

[54] POWER SUPPLY VOLTAGE DROP DETECTION CIRCUIT FOR USE IN EEPROM MEMORY

[75] Inventor: Kiyokazu Hashimoto, Tokyo, Japan
[73] Assignee: NEC Corporation, Tokyo, Japan
[21] Appl. No.: 444,505
[22] Filed: Nov. 30, 1989

[30] Foreign Application Priority Data

Nov. 30, 1988 [JP] Japan ................................. 63-303610

[51] Int. Cl.[5] ........................ H03K 5/153; H03K 3/01
[52] U.S. Cl. ................................. 307/296.8; 307/310; 307/362; 365/228
[58] Field of Search ................... 307/272.3, 296.5, 592, 307/594, 597, 603, 279, 350, 363, 296.8, 362, 451, 581, 585, 310; 365/226, 228

[56] References Cited

U.S. PATENT DOCUMENTS

| | | | |
|---|---|---|---|
| 4,293,782 | 10/1981 | Tanaka et al. | 307/350 |
| 4,649,292 | 3/1987 | Rusznyak | 307/362 |
| 4,658,156 | 4/1987 | Hashimoto | 307/296.5 |
| 4,716,323 | 12/1987 | Wada et al. | 307/594 |
| 4,717,840 | 1/1988 | Ouyang et al. | 307/594 |
| 4,760,284 | 7/1988 | Taylor | 307/296.8 |
| 4,812,679 | 3/1989 | Mahabadi | 307/296.5 |
| 4,874,965 | 10/1989 | Campardo et al. | 307/272.3 |

FOREIGN PATENT DOCUMENTS

| | | | |
|---|---|---|---|
| 0143029 | 11/1979 | Japan | 307/350 |
| 0154365 | 12/1979 | Japan | 307/272.3 |
| 0047727 | 4/1980 | Japan | 307/272.3 |
| 0118220 | 9/1980 | Japan | 307/350 |
| 0128162 | 10/1980 | Japan | 307/350 |

Primary Examiner—Stanley D. Miller
Assistant Examiner—Toan Tran
Attorney, Agent, or Firm—Sughrue, Mion, Zinn, Macpeak & Seas

[57] ABSTRACT

A power supply voltage drop detection circuit has first and second N-channel field-effect-transistors. The drain of the first N-channel FET is connected to a power supply voltage line and its gate to ground. The drain of the second N-channel FET connected to the source of the first N-channel FET and its source is connected to the ground. A control voltage to the gate of the second N-channel FET maintains the second N-channel FET conducting. A P-channel field-effect-transistor has its source connected to the power supply voltage line and its gate connected to a connection node between the first and second N-channel field-effect-transistors. A third N-channel FET has its drain connected to the drain of the P-channel FET and its source connected to the ground. The gate of the third N-channel FET receives a controlled gate voltage which maintains the third N-channel FET conducting. An inverter has its input connected to a node between the P-channel FET and the third N-channel FET. The inverter output generates a signal indicative of the power supply voltage drop.

4 Claims, 3 Drawing Sheets

POWER SUPPLY VOLTAGE DROP DETECTION CIRCUIT FOR USE IN EEPROM MEMORY

BACKGROUND OF THE INVENTION

1. Field of the Invention

The present invention relates to a circuit for detecting a drop of a power supply voltage, and more specifically to such a detecting circuit which is mainly composed of insulated-gate field-effect-transistors (called "IGFETs" in the specification) and which is used for an electrically erasable programmable memory (called "EEPROM" in the specification).

2. Description of Related Art

Since EEPROMs are electrically erasable and electrically programmable, the EEPROMs can be set to various modes shown in the following table by applying a high level signal or a low level signal to external input terminals labelled for example CE, WE and OE under a condition in which the EEPROMs is assembled in an actual apparatus or system.

TABLE 1

| MODE | TERMINAL | | | |
|---|---|---|---|---|
| | CE | WE | OE | I/O |
| READ | L | H | L | DATA OUTPUT |
| WRITE | L | L | H | DATA INPUT |
| STANDBY | H | X | X | HIGH IMPEDANCE |
| WRITE INHIBIT | X | X | H | — |
| | X | H | X | | where "H" indicates a high level, "L" indicates a low level, and "X" indicates a high level or a low level.

Therefore, if a power supply is shut down or a power supply voltage drops down below a tolerable level due to a trouble of a system incorporating the EEPROM therein, a memory cell in the EEPROM is erroneously written or erased. In the above table, for example, when the EEPROM is in the standby mode in which the CE and OE terminals are at a high level and, the WE terminal is at a low level, if the power supply voltage drops, a voltage applied to the CE terminal is brought from the high level to a low level and a voltage applied to the OE terminal is also brought from the high level to a low level. At this time, assuming that a capacitive load of the OE terminal is ten times a capacitive load of the CE terminal, a voltage drop of the CE terminal is faster than that of the OE terminal. As a result, the EEPROM is instantly put in the write mode, and therefore, data appearing on the input/output (I/O) terminal of the EEPROM (in this case, the data is indefinite since the I/O terminal is in the high impedance condition) is erroneously written to a memory cell of a certain address of the EEPROM.

Therefore, in order to avoid the above mentioned erroneous writing caused due to the power supply voltage drop, the EEPROM has generally incorporated therein a circuit for detecting the power supply voltage drop, and has been designed to inhibit the writing when a power supply voltage drop is detected by the power supply voltage drop detection circuit.

Specifically, the power supply voltage drop detection circuit is to detect whether or not a power supply voltage Vcc drops not greater than a predetermined detection level Vcc(INV). For example, the power supply voltage drop detection circuit outputs a high level signal when Vcc > Vcc(INV), and a low level signal when Vcc ≤ Vcc(INV). The detection level Vcc(INV) is previously determined to be smaller than a tolerable level of the power supply voltage, in order to ensure that the EEPROM is never put in the write inhibit status under an ordinary use condition. In addition, the detection level Vcc(INV) is desired to be as stable as possible independently of a temperature of environment of the EEPROM and variation of device parameters caused at the stage of manufacturing. If the detection level Vcc(INV) becomes higher than the tolerable level, the EEPROM can no longer be written under the ordinary use condition. On the other hand, if the detection level Vcc(INV) is too low, the power supply voltage drop detection circuit may not accurately detect a power supply voltage drop, so that an erroneous writing would often occur due to the power supply voltage drop.

One typical conventional power supply voltage drop detection circuit has included a voltage divider circuit composed of three N-channel IGFETs series-connected between a power supply voltage line and ground, each of the N-channel IGFETs being connected in the form of an active load. A connection node between the N-channel IGFET having a source connected to the ground and another N-channel IGFET having a source connected to a drain of the source grounded N-channel IGFET is connected to a first inverter, which is cascaded to a second inverter.

With this arrangement, assuming that the three N-channel IGFETs have the same threshold Vth, if Vcc > 3 Vth, the voltage on the connection node concerned is higher than Vth, and therefore, the second inverter outputs a high level signal. On the other hand, if Vcc ≤ 3 Vth, the voltage on the connection node drops, and therefore, the second inverter outputs a low level signal. Therefore, in the power supply voltage drop detection circuit mentioned above, it can be said that the detection level Vcc(INV) ≈ 3 Vth. In addition, as mentioned hereinbefore, it is desired that even if the temperature changes, Vcc(INV) (namely, 3 Vth) is as stable as possible. However, in fact, the threshold Vth has an apparently perceivable temperature dependency, and therefore, the temperature dependency of the detection level Vcc(INV) ≈ 3 Vth is three times that of a single N-channel IGFET. As a result, in some example, Vcc(INV) is 3.42 V at 25° C. and 2.85 V at 100° C. Namely, Vcc(INV) will change by 0.57 V with a temperature variation of 75° C.

As mentioned above, the conventional power supply voltage drop detection circuit is such that the detection level Vcc(INV) is set three times the threshold Vth of each N-channel IGFET. Therefore, if the threshold Vth of each N-channel IGFET changes from the rated value of 25° C. by ΔVth because of a temperature variation, the detection level Vcc(INV) greatly changes by 3ΔVth. In other words, if the temperature lowers, the detection level Vcc(INV) increases, and therefore approaches a tolerable level of the power supply voltage (for example, 4.5 V or 5.5 V). On the other hand, if the temperature elevates, the detection level Vcc(INV) decreases, and therefore, the power supply voltage drop detection circuit is brought into a condition of not accurately detecting a power supply voltage drop.

Therefore, the conventional power supply voltage drop detection circuit has to have been designed to determine the detection level Vcc(INV) taking the temperature dependency of Vth into consideration, in order to ensure that the detection level Vcc(INV) at a low temperature exceeds the tolerable level of the power supply voltage. This has made it difficult to design the power supply voltage drop detection circuit. On the other hand, since the detection level Vcc(INV) becomes too low at an elevated temperature, it is not possible to prevent a malfunction of the EEPROM caused due to the power supply voltage drop, over a wide range of temperature. As a result, the range of use temperature of the system has to have been limited.

SUMMARY OF THE INVENTION

Accordingly, it is an object of the present invention to provide a power supply voltage drop detection circuit which has overcome the above mentioned defect of the conventional one.

Another object of the present invention is to provide a power supply voltage drop detection circuit which is easy to design and which has an enlarged range of use temperature.

The above and other objects of the present invention are achieved in accordance with the present invention by a power supply voltage drop detection circuit comprising a first N-channel field-effect-transistor of a depletion type having a drain connected to a power supply voltage line and a gate connected to ground, a second N-channel field-effect-transistor having a drain connected to a source of the first N-channel field-effect-transistor and a source connected to the ground, a gate of the second N-channel field-effect-transistor being connected to receive a controlled gate voltage which ceaselessly maintains the second N-channel field-effect-transistor in a conducting condition, a P-channel field-effect-transistor of an enhancement type having a source connected to the power supply voltage line and a gate connected to a connection node between the first and second N-channel field-effect-transistors, a third N-channel field-effect-transistor having a drain connected to a drain of the P-channel field-effect-transistor and a source connected to the ground, a gate of the third N-channel field-effect-transistor being connected to receive a controlled gate voltage which ceaselessly maintains the third N-channel field-effect-transistor in a conducting condition, and an inverter having an input connected to a connection node between the P-channel field-effect-transistor and the third N-channel field-effect-transistor and having an output generating a signal indicative of a power supply voltage drop.

With the above mentioned arrangement, a power supply voltage to be detected, namely a detection level is determined by a sum of a threshold $|V_{TD}|$ of the first N-channel field-effect-transistor having a positive temperature characteristics and a threshold $|V_{TP}|$ of the P-channel field-effect-transistor having a negative temperature characteristics. Therefore, the power supply voltage to be detected almost never change with variation of temperature, differently from the conventional power supply voltage drop detection circuit in which the power supply voltage to be detected, namely a detection level is determined by only the threshold $|V_{TN}|$ having a negative temperature characteristics.

The above and other objects, features and advantages of the present invention will be apparent from the following description of preferred embodiments of the invention with reference to the accompanying drawings.

DESCRIPTION OF THE PREFERRED EMBODIMENTS

Figure 1:
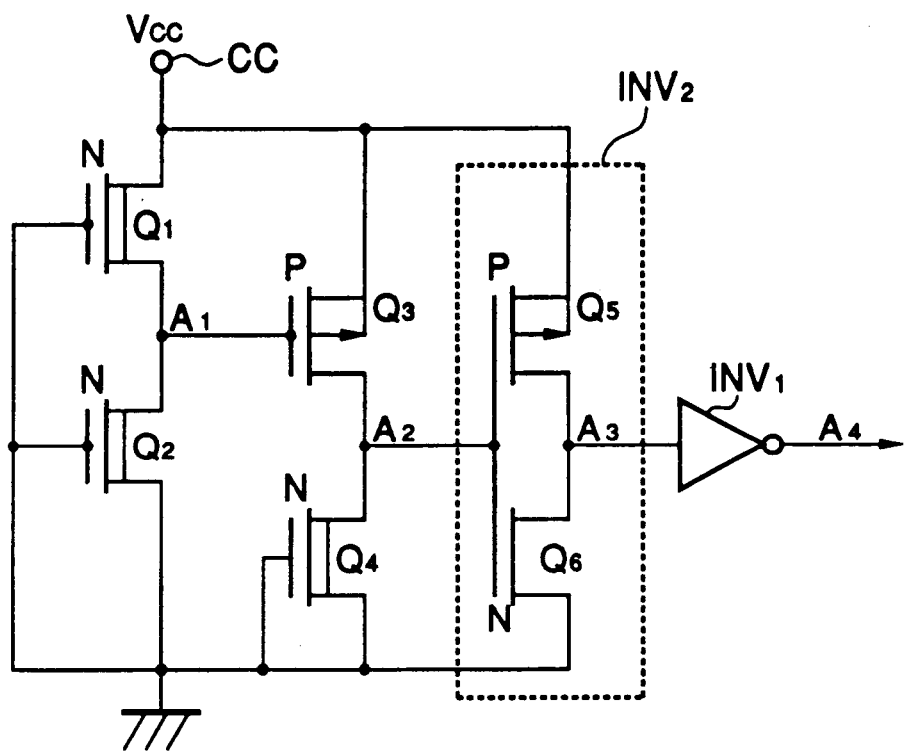
FIG. 1 is a circuit diagram of a first embodiment of the power supply voltage drop detection circuit in accordance with the present invention.

Referring to FIG. 1, there is shown a circuit diagram of a first embodiment of the power supply voltage drop detection circuit in accordance with the present invention. The shown power supply voltage drop detection circuit includes an N-channel depletion insulated-gate field-effect-transistor (called "ND-IGFET" hereinafter) $Q_1$ having a drain connected to a power supply voltage line Vcc and a gate connected to ground, and another ND-IGFET $Q_2$ having a drain connected to a source of the ND-IGFET $Q_1$ and a source and a gate connected to the ground. Since the gate of the ND-IGFETs $Q_1$ and $Q_2$ are grounded, these ND-IGFETs are ceaselessly maintained in a conducting condition. A connection node $A_1$ between the ND-IGFETs $Q_1$ and $Q_2$ is connected to a gate of P-channel enhancement insulated-gate field-effect-transistor (called "PE-IGFET" hereinafter) $Q_3$ having a substrate and a source connected to the power supply voltage line Vcc. A drain of the PE-IGFET $Q_3$ is connected to a drain of an ND-IGFET $Q_4$ having a source and a gate connected to the ground. Since the gate of the ND-IGFET $Q_4$ are grounded, the ND-IGFET $Q_4$ is ceaselessly maintained in a conducting condition. A connection node $A_2$ between the PE-IGFET $Q_3$ and the ND-IGFET $Q_4$ is connected to a gate of a PE-IGFET $Q_5$ and a gate of an N-channel enhancement insulated-gate field-effect-transistor (called "NE-IGFET" hereinafter) $Q_6$. The PE-IGFET $Q_5$ has a substrate and a source connected to the power supply voltage line Vcc. A drain of the PE-IGFET $Q_5$ is connected to a drain of the NE-IGFET $Q_6$, whose source is connected to the ground.

In the above mentioned arrangement, the ND-IGFETs $Q_1$ and $Q_2$ forms a voltage divider, and the PE-IGFET $Q_3$ functions to detect a drop of the power supply voltage Vcc. The PE-IGFET $Q_5$ and the NE-IGFET $Q_6$ form a CMOS inverter $INV_2$. A connection node $A_3$ between the PE-IGFET $Q_5$ and the NE-IGFET $Q_6$ forms an output of the inverter $INV_2$ and is connected to another inverter $INV_1$. The inverter $INV_1$ generates an signal indicative of whether or not a power supply voltage drops below a predetermined detection level.

With the above mentioned arrangement, a gate width-to-length ratios (W/L) of the IGFETs $Q_1$, $Q_2$, $Q_3$ and $Q_4$ are determined to fulfil such a relation that the IG-FET $Q_2$ has a resistance higher than the IG-FET $Q_1$, and the IG-FET $Q_4$ has a resistance higher than the IG-FET $Q_3$. In addition, the gate width-to-length ratios (W/L) of the IGFETs $Q_5$ and $Q_6$ are determined to the effect that the inverter $INV_2$ has a threshold of Vcc/2. For example, the W/L ratio of the IGFETs $Q_1$ and $Q_3$ is designed to have 60/3, and the W/L ratio of the IGFETs $Q_2$ and $Q_4$ is designed to have 6/2000. In addition, the W/L ratio of the IGFET $Q_5$ is designed to have 20/3, and the W/L ratio of the IGFET $Q_6$ is designed to have 10/3. Therefore, a current flowing through the IGFETs $Q_1$ and $Q_2$ and a current flowing through the IGFETs $Q_3$ and $Q_4$ are about 0.5 μA, respectively.

Figure 2:
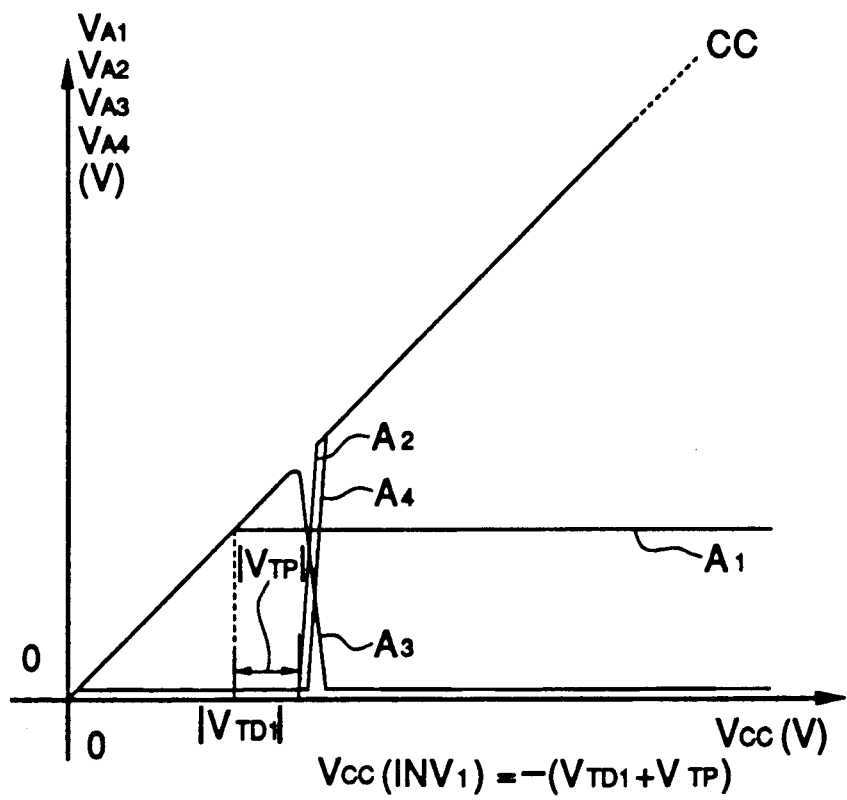
FIG. 2 is a graph illustrating voltage changes at various nodes in the circuit shown in FIG. 1.

Now, an operation of the circuit as mentioned above will be explained with reference to FIG. 2, which is a graph illustrating voltage changes at various nodes in the circuit shown in FIG. 1.

Here, a threshold of the PE-IGFETs is expressed by $V_{TP}$ (<0), and a threshold of the ND-IGFET $Q_1$ is expressed by $V_{TD1}$ (<0).

$$\text{If } Vcc > -(V_{TD1}+V_{TP}) \tag{1}$$

In this case, a potential $V_{A1}$ on the node $A_1$ is fixed at $-V_{TD1}$, the IGFET $Q_3$ is rendered conductive, and therefore, a potential $V_{A2}$ on the node $A_2$ is brought to Vcc. Accordingly, a potential $V_{A3}$ on the node $A_3$ is brought to 0 V, and a potential $V_{A4}$ on the node $A_4$ is brought to Vcc.

$$\text{If } Vcc \leq -(V_{TD1}+V_{TP}) \tag{2}$$

If the power supply voltage Vcc drops and a voltage difference between the power supply voltage Vcc and the potential $V_{A1}$ on the node $A_1$ becomes $V_{TP}$, the IGFET $Q_3$ is turned off. Therefore, the potential $V_{A2}$ on the node $A_2$ is brought to 0 V. Accordingly, a potential $V_{A3}$ on the node $A_3$ is brought to Vcc, and a potential $V_{A4}$ on the node $A_4$ is brought to 0 V.

As seen from the above, a power supply voltage $Vcc(INV_1)$ to be detected in the power supply voltage drop detection circuit shown in FIG. 1 is expressed as follows:

$$\begin{aligned} Vcc(INV_1) &\approx -(V_{TD1}+V_{TP}) \\ &= |V_{TD1}| + |V_{TP}| \end{aligned} \tag{1}$$

where both of $V_{TD1}$ and $V_{TP}$ are negative.

Here, based on "Physics and Technology of Semiconductor Devices", the temperature dependency of $V_{TP}$ is expressed as follows:

$$V_{TP} = V_{FBN} + 2\phi_{Fn} - \{2K_s\epsilon_0 q N_D |(2\phi_{Fn})|\}^{\frac{1}{2}}/C_{ox} \tag{2}$$

where
$V_{FBN}$ is the flat-band voltage of an N-type semiconductor of a substrate.
$\phi_{Fn}$ is the Fermi level of an N-type semiconductor of a substrate ($\phi_{Fn}<0$)
$N_D$ is a donor concentration of an N-type semiconductor of a substrate.
$C_{ox}$ is a gate insulator thickness.

$$C_{ox} = \epsilon_0 \cdot K_{ox}/t_{ox}, \text{ and } K_{ox} = 3.8$$

$K_s$ is a dielectric constant (=11.8).
$\epsilon_0$ is the dielectric of vacuum (=$8.854\times10^{-22}$ F/m).

On the other hand, the temperature dependency of $V_{TD1}$ is expressed as follows:

$$\begin{aligned} V_{TD1} &= V_{FBP} + 2\phi_{Fp} + \{2K_s\epsilon_0 q N_A |(2\phi_{Fp})|\}^{\frac{1}{2}} \\ &/C_{ox} - (qT_cN_c)/C_{ox} \end{aligned} \tag{3}$$

where
$V_{FBP}$ is the flat-band voltage of a P-type semiconductor of a substrate.
$\phi_{Fp}$ is the Fermi level of a P-type semiconductor of a substrate ($\phi_{Fp}>0$)
$N_A$ is an accepter concentration of a P-type semiconductor of a substrate.
$N_c$ is a concentration of donor doped for bringing the transistor into a depletion type.
$T_c$ is a depth of donor doped into a substrate.

Furthermore, $V_{FBN}$ is expressed as follows:

$$\begin{aligned} V_{FBN} &= \phi_M - \phi_{SN} \\ &= (1/q)\{-q\chi - E_g/2 + kT \cdot \ln(N_D/n_i)\} \end{aligned} \tag{4}$$

where
$\phi_M$ is the work function of an electrode (aluminum)
$\phi_{SN}$ is the work function of an N-type semiconductor
$\chi$ is an electron affinity of silicon
$E_g$ is energy gap of silicon (=1.1 eV)
k is Boltzmann's constant (=$8.62\times10^{-5}$ eV/K)
T is absolute temperature
$n_i$ is intrinsic carrier concentration On the other hand, $\phi_{Fn}$ is expressed as follows:

$$\phi_{Fn} = -(kT/q)\cdot\ln(N_D/n_i)\} \tag{5}$$

Here, assume that $\phi_M=4.25$ V, $\chi=4.1$ V, $E_g=1.1$ V, $C_{ox}=500$ Å, $K_s=11.8$, $n_i=1.45\times10^{16}/m^3$ at 25° C., and $N_D=6\times10^{21}/m^3$ at 25° C. Under this condition, $\phi_{Fn}$ at 25° C. can be obtained as follows:

$$\phi_{Fn}(25°\text{ C.}) = -0.33\text{V} \tag{6}$$

Therefore, $V_{TP}$ at 25° C. can be obtained from the equation (2) as follows:

$$\begin{aligned} V_{TP}(25°\text{ C.}) &= (-0.07\text{ V}) + (-0.66\text{ V}) - (0.54\text{ V}) \\ &= -1.27\text{ V} \end{aligned} \tag{7}$$

Accordingly, assuming $N_A=2.5\times10^{22}/m^3$ at 25° C., $N_c=1.38\times10^{23}/m^3$ at 25° C. and $T_c=10^{-7}$ m, $V_{TD1}$ at 25° C. can be obtained from the equation (3) as follows:

$$\begin{aligned} V_{TD1}(25°\text{ C.}) &= (-0.77\text{ V}) + (-0.74\text{ V}) - (1.17\text{ V}) - (3.28\text{ V}) \\ &= -2.14\text{ V} \end{aligned} \tag{8}$$

Therefore, $Vcc(INV_1)$ at 25° C. can be obtained from the equation (1) as follows:

$$\begin{aligned} Vcc(INV_1) &= -(-2.14\text{ V} - 1.27\text{ V}) \\ &= 3.41\text{ V} \end{aligned} \tag{9}$$

On the other hand, assuming $n_i=2\times10^{18}/m^3$ at 100° C., $\phi_{Fn}$ at 100° C. can be obtained as follows:

$$\phi_{Fn}(100°\text{ C.}) = -0.26\text{V} \tag{10}$$

Therefore, assuming that $E_g$ does not change with variation of temperature, $V_{TP}$ at 100° C. can be expressed as follows:

$$V_{TP}(100° C.) = (-0.14 \text{ V}) + (-0.52 \text{ V}) - (0.48 \text{ V}) \qquad (11)$$
$$= -1.14 \text{ V}$$

Accordingly, since it is considered that the value of (q Tc Nc)/$C_{ox}$ at 100° C. is substantially the same as that st 25° C., $V_{TD1}$ at 100° C. can be expressed as follows:

$$V_{TD1}(100° C.) = (-0.70 \text{ V}) + (-0.60 \text{ V}) + (1.05 \text{ V}) - (3.28 \text{ V}) \qquad (12)$$
$$= -2.33 \text{ V}$$

Therefore, Vcc(INV$_1$) at 100° C. can be expressed as follows:

$$Vcc(INV_1) = -(-2.33 \text{ V} - 1.41 \text{ V}) \qquad (13)$$
$$= 3.47 \text{ V}$$

As seen from the above, the power supply voltage drop detection circuit shown in FIG. 1 detects 3.41 V at 25° C. and 3.47 V at 100° C. as the power supply voltage drop detection voltage Vcc(INV$_1$). Namely, the power supply voltage drop detection voltage Vcc(INV$_1$) changes only by 0.06 V with variation of temperature 75° C. This is about one-tenth of the prior art power supply voltage drop detection circuit mentioned hereinbefore.

Figure 3:
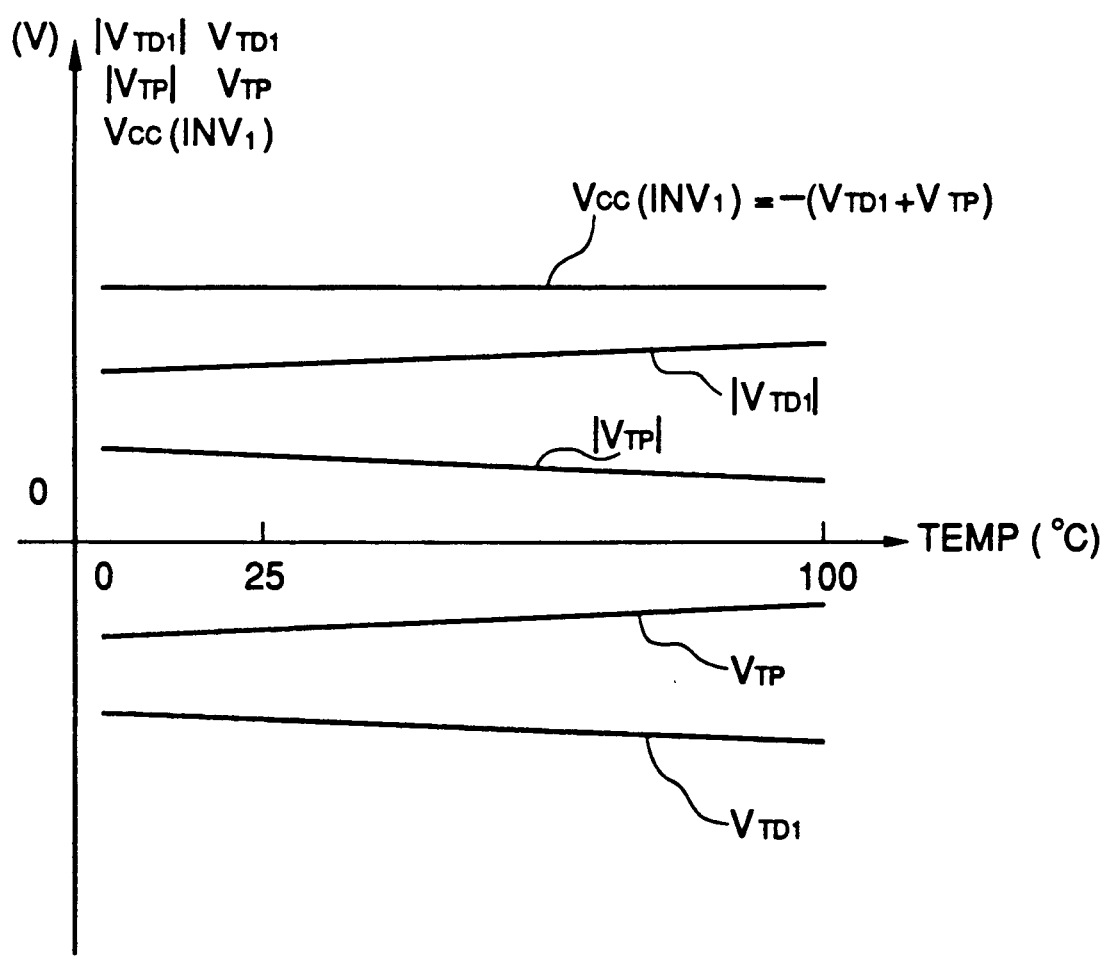
FIG. 3 is a graph illustrating a temperature characteristics of the circuit shown in FIG. 1.

Referring to FIG. 3, there is shown a graph illustrating a temperature characteristics, particularly $V_{TP}$, $V_{TD1}$ and Vcc(INV$_1$) of the circuit shown in FIG. 1, which are based on the equations (1) to (3).

Focusing on the equation (3) for $V_{TD1}$, since the value of (q Tc Nc)/$C_{ox}$ does not change almost with variation of temperature, the temperature of the $V_{TD1}$ is determined by first three items of the right-hand side of the equation (3). Therefore, the absolute value $|V_{TD1}|$ of $V_{TD1}$ becomes large with increase of temperature. Namely, $|V_{TD1}|$ has a positive temperature characteristics. On the other hand, $|V_{TP}|$ expressed by the equation (2) becomes small with increase of temperature. Namely, $|V_{TP}|$ has a negative temperature characteristics. Therefore, Vcc(INV$_1$), which is a sum of $|V_{TD1}|$ and $|V_{TP}|$, is very stable against variation of temperature, since a variation due to the positive temperature characteristics is cancelled by a variation due to the negative temperature characteristics.

Figure 4:
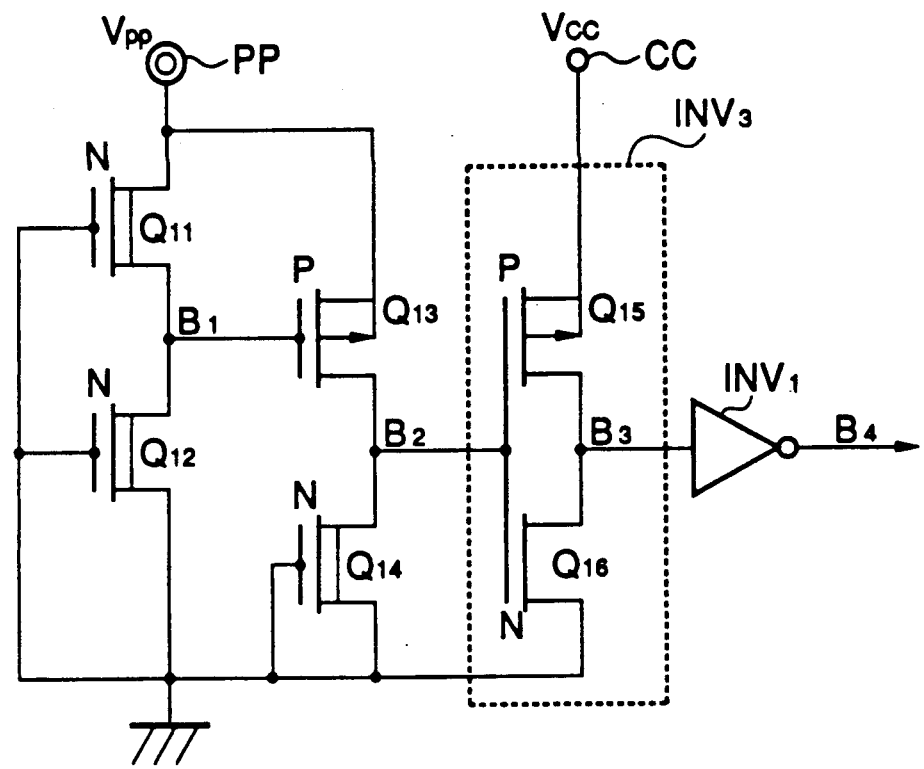
FIG. 4 is a circuit diagram of a second embodiment of the power supply voltage drop detection circuit in accordance with the present invention.

Referring to FIG. 4, there is shown a circuit diagram of a second embodiment of the power supply voltage drop detection circuit in accordance with the present invention. This embodiment is adapted for a high voltage detection circuit for use in an electrically programmable memory (called "EPROM" hereinafter).

In this second embodiment, IGFETs Q$_{11}$ to Q$_{16}$ correspond to the IGFETs Q$_1$ to Q$_6$ of the first embodiment shown in FIG. 1, respectively, and each has the same gate width-to-length (W/L) ratio as that of a corresponding IGFET Q$_1$, Q$_2$, Q$_3$, Q$_4$, Q$_5$ or Q$_6$.

As seen from comparison between FIGS. 1 and 4, the second embodiment is different from the first embodiment only in that a drain of the IGFET Q$_{11}$ and a substrate and a source of the IGFET Q$_{13}$ are connected to an external input terminal PP for Vpp and a source of the IGFET Q$_{15}$ of the inverter INV3 is connected to a power supply terminal CC for Vcc.

Figure 5:
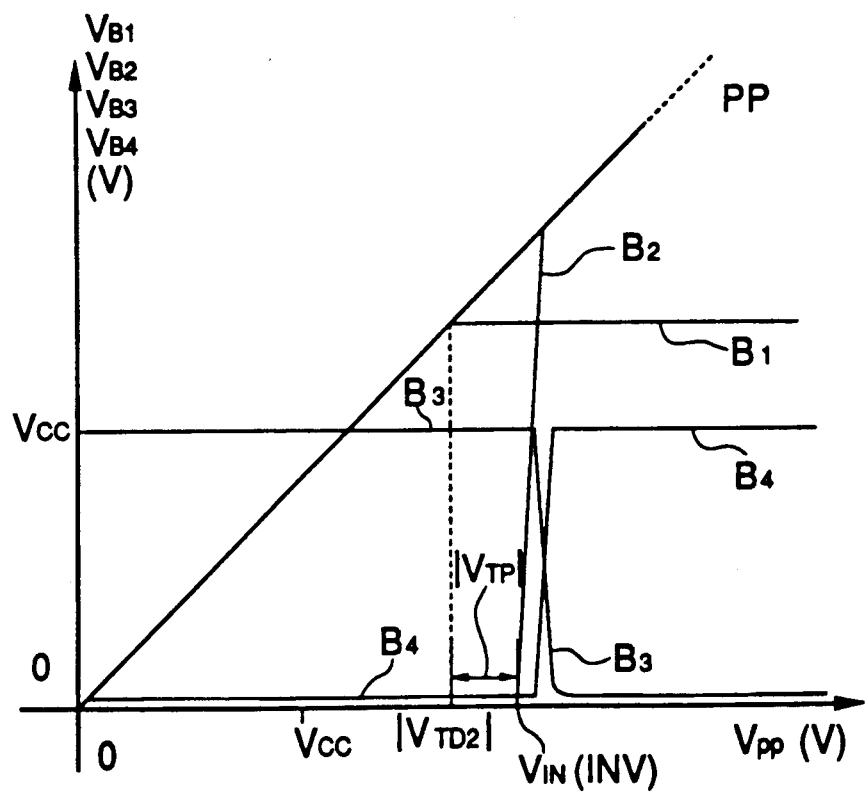
FIG. 5 is a graph illustrating voltage changes at various nodes in the circuit shown in FIG. 4.

FIG. 5 is a graph illustrating voltage changes at various nodes B$_1$, B$_2$, B$_3$ and B$_4$ in the circuit shown in FIG. 4 when a voltage Vpp applied to the terminal PP changes.

Now, an operation of the second embodiment will be explained, assuming that a threshold of the PE-IGFETs is expressed by $V_{TP}(<0)$, and a threshold of the ND-IGFET Q$_{11}$ is expressed by $V_{TD2}(<0)$.

$$\text{If } Vpp > -(V_{TD2} + V_{TP}) \qquad (1)$$

In this case, since a potential $V_{B1}$ on the node B$_1$ is fixed at $-V_{TD2}$, the IGFET Q$_{13}$ is rendered conductive, and therefore, a potential $V_{B2}$ on the node B$_2$ is brought to Vpp. Accordingly, a potential $V_{B3}$ on the node B$_3$ is brought to 0 V, and a potential $V_{B4}$ on the node B$_4$ is brought to Vcc.

$$\text{If } Vpp \leq -(V_{TD2} + V_{TP}) \qquad (2)$$

If the voltage Vpp drops and a voltage difference between the voltage Vpp and the potential $V_{B1}$ on the node B$_1$ becomes $V_{TP}$, the IGFET Q$_{13}$ is turned off. Therefore, the potential $V_{B2}$ on the node B$_2$ is brought to 0 V. Accordingly, a potential $V_{B3}$ on the node B$_3$ is brought to Vcc, and a potential $V_{B4}$ on the node B$_4$ is brought to 0 V.

As seen from the above, a power supply voltage Vpp(INV) to be detected in the power supply voltage drop detection circuit shown n FIG. 4 is expressed as follows:

$$Vpp(INV) = -(V_{TD2} + V_{TP}) \qquad (14)$$
$$= |V_{TD2}| + |V_{TP}|$$

where both of $V_{TD2}$ and $V_{TP}$ are negative.

Therefore, the change of Vpp(INV) caused by variation of temperature can be explained with the explanation of Vcc(INV$_1$) in the first embodiment, by substituting $V_{TD2}$ for $V_{TD1}$ and Nc' for Nc, where Nc' is a donor concentration required to cause the IGFET Q$_{11}$ to have the threshold $V_{TD2}$.

For example, assuming that $V_{TP}$ and $V_{TN}$ at 25° C. are respectively set to $V_{TP}=-1.27$ V and $V_{TN}=1.14$ V, and the Nc' is set to realize (q Tc Nc')/$C_{ox}=8$ V, Vpp(INV) at 25° C. is expressed as follows:

$$Vpp(INV) = -(V_{TD2} + V_{TD}) \qquad (15)$$
$$= -(1.14 \text{ V} - 8 \text{ V} - 1.27 \text{ V}) = 8.13 \text{ V}$$

Similarly, Vpp(INV) at 100° C. is expressed as follows:

$$Vpp(INV) = -(V_{TD2} + V_{TD}) \qquad (16)$$
$$= -(0.95 \text{ V} - 8 \text{ V} - 1.14 \text{ V}) = 8.19 \text{ V}$$

Namely, the voltage drop detection voltage Vpp(INV) changes only by 0.06 V with variation of temperature from 25° C. to 100° C.

Thus, even in the second embodiment, since the voltage drop detection voltage Vpp(INV) is determined by a sum of $|V_{TD2}|$ having a positive temperature characteristics and $|V_{TP}|$ having a negative temperature characteristics, the external voltage drop detection voltage Vpp(INV) will not change almost with variation of temperature.

As mentioned above, since the external voltage drop detection voltage Vpp(INV) will not change almost with variation of temperature in the EPROM incorporating the high voltage detection of the second embodiment therein, the EPROM can be used over a wide range of temperature, and the detection high voltage Vpp(INV) can be freely determined or set by adjusting the concentration of the donor doped to the IGFET $Q_{11}$ for the depletion type.

The invention has thus been shown and described with reference to the specific embodiments. Howeve, it should be noted that the present invention is in no way limited to the details of the illustrated structures but changes and modifications may be made within the scope of the appended claims.

For example, each of the ND-IGFETs $Q_2$ and $Q_4$ can be replaced by another IGFET ceaselessly maintained in a conductive condition, for example, an NE-IGFET having a gate connected to the power supply line As seen from the above description, in the power supply voltage drop detection circuit in accordance with the present invention, the detection voltage is determined by a sum of a first threshold having a positive temperature characteristics and a second threshold having a negative temperature characteristics, the detection voltage will not greatly deviate from a designed value with variation of temperature. Therefore, the power supply voltage drop detection circuit can be designed without paying the attention to change of the detection voltage caused by variation of temperature. Since the detection voltage will not change almost at an elevated temperature, it is possible to prevent an erroneous writing to a semiconductor memory such as EEPROM caused by power supply voltage drop over a wide range of temperature. As a result, the usable temperature range can be extended.

I claim:

1. A power supply voltage drop detection circuit comprising a first N-channel field-effect-transistor of a depletion type having a drain connected to a power supply voltage line and a gate connected to ground, said first N-channel field-effect-transistor having a threshold whose absolute value has a positive temperature characteristic, a second N-channel field-effect-transistor having a drain connected to a source of the first N-channel field-effect-transistor and a source connected to the ground, a gate of the second N-channel field-effect-transistor being connected to receive a controlled gate voltage which ceaselessly maintains the second N-channel field-effect-transistor in a conducting condition, a P-channel field-effect-transistor of an enhancement type having a source connected to the power supply voltage line and a gate connected to a connection node between the first and second N-channel field-effect-transistors, said P-channel field-effect-transistor having a threshold whose absolute value has a negative temperature characteristic, a third N-channel field-effect-transistor having a drain connected to a drain of the P-channel field-effect-transistor and a source connected to the ground, a gate of the third N-channel field-effect-transistor being connected to receive a controlled gate voltage whose ceaselessly maintains the third N-channel field-effect-transistor in a conducting condition, and an inverter having an input connected to a connection node between the P-channel field-effect-transistor and a third N-channel field-effect-transistor and having an output generating a signal which is a function of the sum of the absolute value of the threshold of the first N-channel field-effect-transistor and the absolute value of the threshold of the P-channel field-effect-transistor and indicative of a power supply voltage drop.

2. A circuit claimed in claim 1 wherein each of the second and third N-channel field-effect-transistors is of a depletion type, and a gate of each of the second and third N-channel field-effect-transistors is connected to ground.

3. A circuit claimed in claim 1 wherein the second N-channel field-effect-transistor has a resistance high than that of the first N-channel field-effect-transistor and the third N-channel field-effect-transistor has a resistance high than that of the P-channel field-effect-transistor.

4. A power supply voltage drop detection circuit comprising:

a voltage divider including first and second field-effect-transistors series-connected between a supply voltage line and a ground and ceaselessly maintained in a conducting condition, one of the field-effect-transistors, which is connected to the supply voltage line, having a threshold voltage having a positive temperature characteristic;

a detection circuit including a third field-effect-transistor having a threshold voltage having a negative temperature characteristic and having a gate connected to a connection node between the first and second field-effect-transistors, the third field-effect-transistor having a current path having a first end connected to the supply voltage line and a second end connected to the ground through a fourth field-effect-transistor ceaselessly maintained in a conducting condition; and an output circuit having an input connected to a connection node between the third and fourth field-effect-transistors and having an output generating a signal which is a function of the sum of the absolute value of the threshold of the first field-effect-transistor and the absolute value of the threshold of the third field-effect-transistor and indicative of a power supply voltage drop.

* * * * *

UNITED STATES PATENT AND TRADEMARK OFFICE
CERTIFICATE OF CORRECTION

PATENT NO. : 5,008,566
DATED : April 16, 1991
INVENTOR(S) : Kiyokazu HASHIMOTO

It is certified that error appears in the above-identified patent and that said Letters Patent is hereby corrected as shown below:

Col. 1, line 19, delete "CE, WE and OE" and insert --$\overline{CE}$, $\overline{WE}$ and $\overline{OE}$--;

line 25, delete "$\overline{I/O}$" and insert --I/O--;

line 40, delete "CE" and insert --$\overline{CE}$--;

line 41, delete "OE" and insert --$\overline{OE}$-- and delete "WE" and insert --$\overline{WE}$--;

line 43, delete "CE" and insert --$\overline{CE}$--;

line 44, delete "OE" and insert --$\overline{OE}$--;

line 47, delete "OE" and insert --$\overline{OE}$-- and delete "CE" and insert --$\overline{CE}$--;

line 48, delete "CE" and insert --$\overline{CE}$--;

line 49, delete "OE" and insert --OE--;

Col. 4, line 62, delete "fulfil" and insert --fulfill--;

Col. 7, line 8, delete "st" and insert --at--;

Col. 8, line 28, delete "n" and insert --in--;

Col. 9, line 11, delete "Howeve" and insert --However--;

line 19, after "line" insert --.--;

UNITED STATES PATENT AND TRADEMARK OFFICE
CERTIFICATE OF CORRECTION

PATENT NO. : 5,008,566

DATED : April 16, 1991

INVENTOR(S) : Kiyokazu Hashimoto

It is certified that error appears in the above-identified patent and that said Letters Patent is hereby corrected as shown below:

Col. 10, line 26, delete "high' and insert --higher--.

Signed and Sealed this

Sixth Day of October, 1992

*Attest:*

DOUGLAS B. COMER

*Attesting Officer*     *Acting Commissioner of Patents and Trademarks*